(12) United States Patent
Tobias et al.

(10) Patent No.: US 7,019,479 B2
(45) Date of Patent: Mar. 28, 2006

(54) ELECTRONICALLY COMMUTABLE MOTOR

(75) Inventors: Ralph Tobias, Baden-Baden (DE); Stefan Beyer, Buehl (DE); Joerg Sutter, Gaggenau (DE); Ingo Immendoerfer, Buehl (DE); Heiko Frey, Kuppenheim (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 10/483,592

(22) PCT Filed: Feb. 27, 2003

(86) PCT No.: PCT/DE03/00627

§ 371 (c)(1),
(2), (4) Date: Jun. 23, 2004

(87) PCT Pub. No.: WO03/099632

PCT Pub. Date: Dec. 4, 2003

(65) Prior Publication Data

US 2004/0257018 A1    Dec. 23, 2004

(30) Foreign Application Priority Data

May 24, 2002    (DE) .................................. 102 23 139

(51) Int. Cl.
*H01R 39/46*    (2006.01)

(52) U.S. Cl. ........................ 318/439; 318/254; 318/138

(58) Field of Classification Search ................ 318/439, 318/254, 138, 15, 434, 433, 801, 86, 757, 318/785, 786, 789, 798, 362, 375
See application file for complete search history.

(56) References Cited

U.S. PATENT DOCUMENTS

| | | | | |
|---|---|---|---|---|
| 4,817,471 A | * | 4/1989 | Tury | ........................... 477/125 |
| 4,984,647 A | * | 1/1991 | Morishita et al. | ........... 180/446 |
| 5,659,472 A | | 8/1997 | Nishino et al. | |
| 6,194,849 B1 | * | 2/2001 | Wilson-Jones et al. | ....... 318/15 |

FOREIGN PATENT DOCUMENTS

| | | |
|---|---|---|
| EP | 0 340 044 A | 11/1989 |
| EP | 0 800 979 A | 10/1997 |

* cited by examiner

*Primary Examiner*—Karen Masih
(74) *Attorney, Agent, or Firm*—Ronald E. Greigg

(57) ABSTRACT

An electronically commutatable motor with a preferably three-phase excitation winding in the stator, which, in order to generate a torque for a permanent magnet rotor, can be connected to a direct current source via a motor control unit and a commutation device equipped with semiconductor switches. The motor is intended for use as a drive motor of a safety-critical auxiliary drive unit in a motor vehicle, in particular as the drive motor of an electrical power-assisted steering unit, wherein additional or existing switching means suppress or at least partially compensate for a braking moment that is generated by the motor in the event of a winding short and/or a malfunction in the semiconductor switches of the commutation device.

16 Claims, 2 Drawing Sheets

ELECTRONICALLY COMMUTABLE MOTOR

CROSS-REFERENCE TO RELATED APPLICATIONS

This application is a 35 USC 371 application of PCT/DE 03/00627 filed on Feb. 27, 2003.

BACKGROUND OF THE INVENTION

1. Field of the Invention

The invention relates to an electronically commutatable motor.

2. Description of the Prior Art

German patent application 100 644 86.4 contains a detailed discussion of an electronic control of a motor of the type with which this invention is concerned, and the explanations contained therein also relate to the electronically commutatable motor proposed here.

The method described in German patent application 100 644 86.4 concentrates in particular on determining the rotor position of the electric motor, not on particularly advantageous embodiments made possible through its design and type of control. These are the subject of the current application, which relates to the use of this type of motor as a drive motor for safety-critical auxiliary drive units in motor vehicles, in particular to its use as a drive motor of an electrical power-assisted steering unit. The design and control of a motor of this kind fulfill the requirements of the safety concept of the drive unit, which provides that in the event of a malfunction, it is possible to influence the motor so that it does not exert any moment, in particular no braking moment, that compromises the safety of the motor vehicle when the steering mechanism of a motor vehicle is actuated. The reason for the use of the electronically commutatable motor in the current invention, therefore, is not even primarily the frictionless, low-maintenance design thanks to the lack of brushes, but—in addition to the low degree of moment waviness that can be influenced by the control—in particular the possibility for control in the event of a malfunction in a component of the motor control or in the motor itself, particularly if there is a short-circuit in the winding, where short-circuit currents are produced that are on the same order of magnitude as the rated currents and exert dangerous moments on the drive unit. In particular, malfunctions of this kind can lead to the fact that, for example with an electrical power-assisted steering unit, not only does the steering assist fail, but an opposing moment is also produced, which makes it practically impossible to steer the vehicle.

SUMMARY AND ADVANTAGES OF THE INVENTION

A first advantageous embodiment of the electronically commutatable motor for the use provided is constituted in that the phase windings of the excitation winding can be connected at one end via a half-bridge circuit to the direct current source and at the other end, are connected together to a disconnectable star point in order to switch off a leakage current in the event of a failure of the half-bridge switch of the commutation device. This assures that at least part of the drive output is maintained. In the event of a winding short when an excitation winding is connected in a star pattern, it is not in fact possible to switch off the disturbance variable since the voltage induced in the defective winding upon rotation of the drive motor cannot be switched off. On the other hand, however, after the disconnection of the star point in the defective phase winding, the braking moment produced by the defective winding can be at least partially compensated for by the operation of the motor with the remaining phase windings and consequently, it is possible to assure the maintenance of a partial drive output.

One control possibility for the motor that is particularly suitable in relation to the invention is achieved with the use of a full-bridge circuit for the commutation device; the phase windings of the excitation winding can be individually connected to the direct current source. The ability to control the phase windings of the excitation winding individually is very advantageous because it makes it possible to provide for a limp-home operation if a malfunction occurs in the commutation device and also if a malfunction occurs in one phase winding of the excitation winding. Here, too, a malfunction in the commutation device or a malfunction in one phase winding of the winding also leads to the generation of a braking moment. However, this can be compensated for by means of the two intact phase windings, even without switching off the disturbance variable. The additional possibility of breaking an individual malfunctioning phase winding of the commutation device independently of the other phase windings makes it possible to switch off the disturbance variable by breaking the defective phase winding if there is a malfunction in a semiconductor component, thus permitting the motor to continue operating at ⅔ of its capacity. As when the winding is connected in a star pattern, when a malfunction occurs in one phase of the winding, although it is not possible to switch off the disturbance variable, the braking moment generated can in fact be compensated for to a greater degree than when the winding is connected in a star pattern, because only one phase winding is affected.

The disconnecting of the phase windings occurs in a particularly advantageous manner both when the phase windings are connected in a star pattern and when the phase windings are separately connected via a full-bridge commutation circuit with the aid of existing or additional semiconductor switches, for example by means of MOSFET switches.

BRIEF DESCRIPTION OF THE DRAWINGS

Other details and advantageous modifications of the motor according to the invention will be apparent from the following description of three exemplary embodiments, taken in conjunction with the drawings, in which.

DESCRIPTION OF THE PREFERRED EMBODIMENTS

Figure 1:
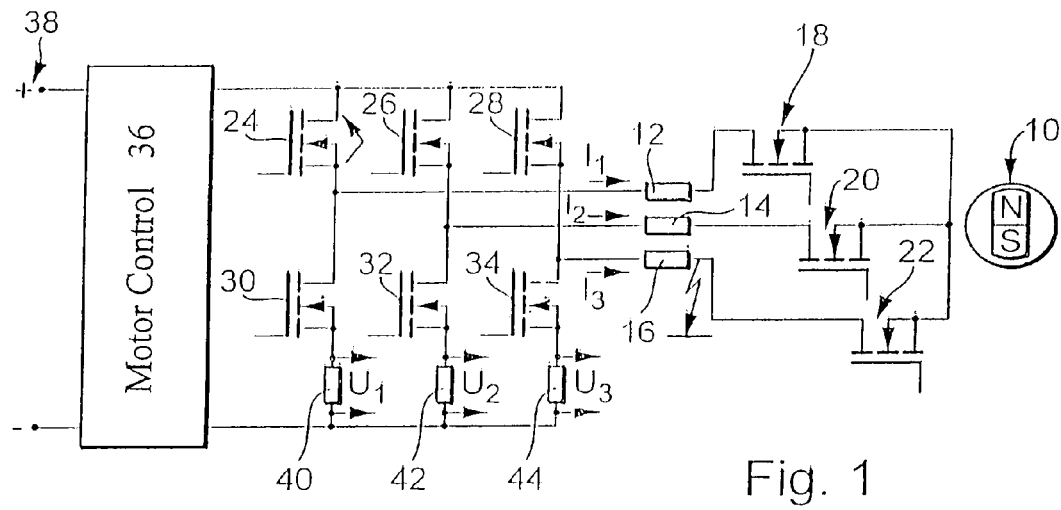
FIG. 1 schematically shows a half-bridge commutation device equipped with semiconductor switches for the phase windings that are connected to one another at a disconnectable star point, and FIGS. 2 & 3 schematically show a circuit arrangement for an electronically commutatable motor whose phase windings can be individually connected to a direct current source via a full-bridge commutation device; in particular, the device according to FIG. 3 takes the use of MOSFET switches into account.

In FIG. 1, the reference numeral 10 indicates the permanent magnet-equipped rotor of an electronically commutatable motor whose three-phase excitation winding is disposed in the stator. The phase windings are labeled 12, 14, and 16 and are connected in the star pattern via MOSFET switches

18, 20, 22. The phase currents $I_1$, $I_2$ $I_3$ flow in the phase windings 12, 14, 16 and are controlled by means of a six-pulse half-bridge circuit, also known as a B6 circuit. The commutation device is likewise comprised of MOSFET switches, which are labeled with the reference numerals 24, 26, 28 and 30, 32, 34, respectively. A motor control 36, which is connected between a direct current source 38 and the inputs of the commutation device, sends the supply voltages and the control instructions to the MOSFET switches 24–34 of the commutation device and to the MOSFET switches 18–22 of the star-shaped circuit.

The electronically commutatable motor according to the invention, with the excitation winding in the stator and a permanent magnet-equipped rotor 10, is also referred to as a brushless direct current motor (BLDC motor). A motor of this kind, including its control, has already been described in extensive detail in DE 100 644 86.4, mentioned above and is also in principle known. It is therefore unnecessary to completely repeat the description of the design and control of the motor in the current application; the explanations will be limited exclusively to those components and circuit features that are essential to its use as a drive motor of a safety-critical auxiliary drive unit in a motor vehicle, preferably as a drive motor of an electrical vehicle steering mechanism, i.e. the measures and possibilities for disconnecting in the event of semiconductor or winding malfunctions.

In the circuit arrangement according to FIG. 1, during proper operation, the MOSFET switches 18, 20, 22 are closed and constitute the star point for the phase windings 12, 14, 16. The magnitude and curve of the phase currents $I_2$, $I_2$, $I_3$ are regulated via the MOSFET switches 24, 26, 28 and 30, 32, 34 by means of a pulse-width modulation executed by the motor control 36. In this connection, the respective phase currents $I_1$, $I_2$, $I_3$ are conveyed to the negative poll of the direct current source 38 via the star point and via three measurement resistors 40, 42, 44.

During proper operation of the motor, the three MOSFET switches 18, 20, 22 are closed and define the star point of the excitation winding. The phase currents $I_1$, $I_2$, $I_3$ are determined by the motor control 36; for example with a pulsed MOSFET switch 24, the phase current $I_1$—with the curve predetermined by the pulsation—travels via the conductive MOSFET switch 32 and the resistor 42 back to the negative poll of the direct current source. In the current flow pauses necessitated by the pulsation, the free-running circuit is connected via the phase windings 12 and 14 and via the two MOSFET switches of 30 and 32. During this interval, the switch 32 is conductive and in the MOSFET switch 30, either a passive free-running via the integrated inverse diode is produced or an active free-running is produced through a pulsed switching-on during the circuit-closing pauses of the MOSFET switch 24. The phase currents $I_2$ and $I_3$ are controlled in a corresponding manner.

Malfunctions during the operation of the motor can in particular occur due to a malfunction in one of the semiconductor switches of the commutation device or due to a winding short-circuit in one of the phase windings. For example, in the event of a short-circuit of the MOSFET switch 24, as a result of the voltages that the rotation of the motor induces in the phase windings 12, 14, and 16, a current flows through the inverse diodes of the MOSFET switches 26 and 28 and generates a braking moment, which, when the drive unit is used for an electrical power steering aid in a motor vehicle, renders the vehicle practically unsteerable. In order to counteract this, the remedy according to the invention is for the MOSFET switch 18 to disconnect the star point of the phase windings 12, 14, 16. The disturbance variable is thus switched off and the drive unit remains operational, albeit at a reduced capacity. If a winding short-circuit occurs, for example in the phase winding 16, a braking moment is produced as a result of the induced voltage, but it is not possible in this case to switch off the disturbance variable by disconnecting the winding star point. However, remedial measures are taken in the event of this particular malfunction in that by using the MOSFET switches 18–22 to disconnect the star point, at least one braking moment can be compensated for, which would counteract the steering force exerted by the driver when the motor is used as a power steering unit in a motor vehicle. This preserves the unassisted steering function.

Figure 2:
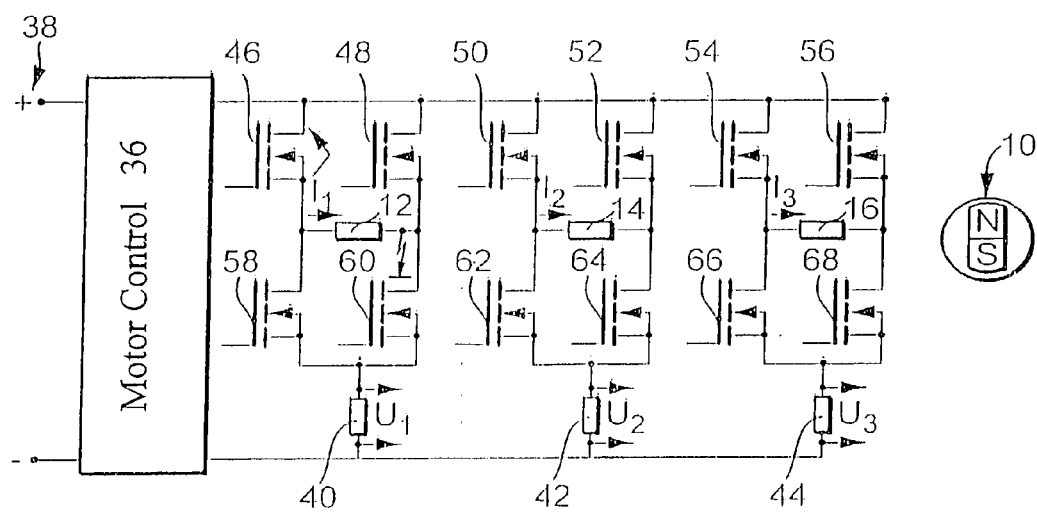

The arrangement in FIG. 2 is also an electronically commutatable motor with a three-phase excitation winding in the stator and a permanent magnet-excited rotor. Parts that are the same as in FIG. 1 have been provided with the same reference numerals. By contrast with the circuit arrangement in FIG. 1, in FIG. 2 a full-bridge circuit comprised of semiconductor switches 46–68 is provided, also referred to as a 3H circuit, for commutating the phase windings 12, 14, and 16. This allows the phase windings to be individually connected to and disconnected from the direct current source 38, which provides even more extensive possibilities for malfunction compensation than in the circuit arrangement according to FIG. 1, in which three individual drivers that are basically already provided in a full-bridge circuit are required for the separate control of the phase windings instead of a shared B6 bridge driver. In addition, the arrangement according to FIG. 2 can also significantly reduce the losses due to the free-running currents in the commutation pauses through an active free-running if the free-running current is conveyed via the respectively associated MOSFET switch that is switched on with the clock frequency. For example, with a phase current $I_1$ that is pulsed by the MOSFET switch 46, the MOSFET switch 58 would then have to be switched into the conductive state in the current flow pauses in accordance with the clock frequency so that the free-running current of the phase winding 12 can be compensated for by means of the MOSFET switch 60 that is switched on continuously during this time interval and by means of the MOSFET switch 58 that is switched into the conductive state in a pulsed fashion. The pulsation in the MOSFET switches can be selected to be analogous to the pulsation of the MOSFET switches in FIG. 1 so that the desired wave form is produced in order to minimize the moment waviness.

With the circuit arrangement according to FIG. 2, if a malfunction occurs in the MOSFET switch 46, for example, which causes it to be switched permanently into a conductive state, then a current flows through it and through the phase winding 12 and the inverse diode of the MOSFET switch 48, which generates a braking moment in the drive unit. In this case, the full-bridge circuit then offers the possibility of compensating for the braking moment without switching off the disturbance variable so that the drive unit can continue to operate at partial capacity by means of the two unaffected phase windings 14 and 16.

If the malfunction that has occurred is a winding short, for example in the phase winding 12, then it is not possible to switch off the disturbance variable and a braking moment is generated. But since only one phase winding is affected and the two other phase windings of the motor remain unaffected, the generated braking moment can be compensated for by means of the two intact phase windings so that the unassisted steering function is maintained.

Figure 3:
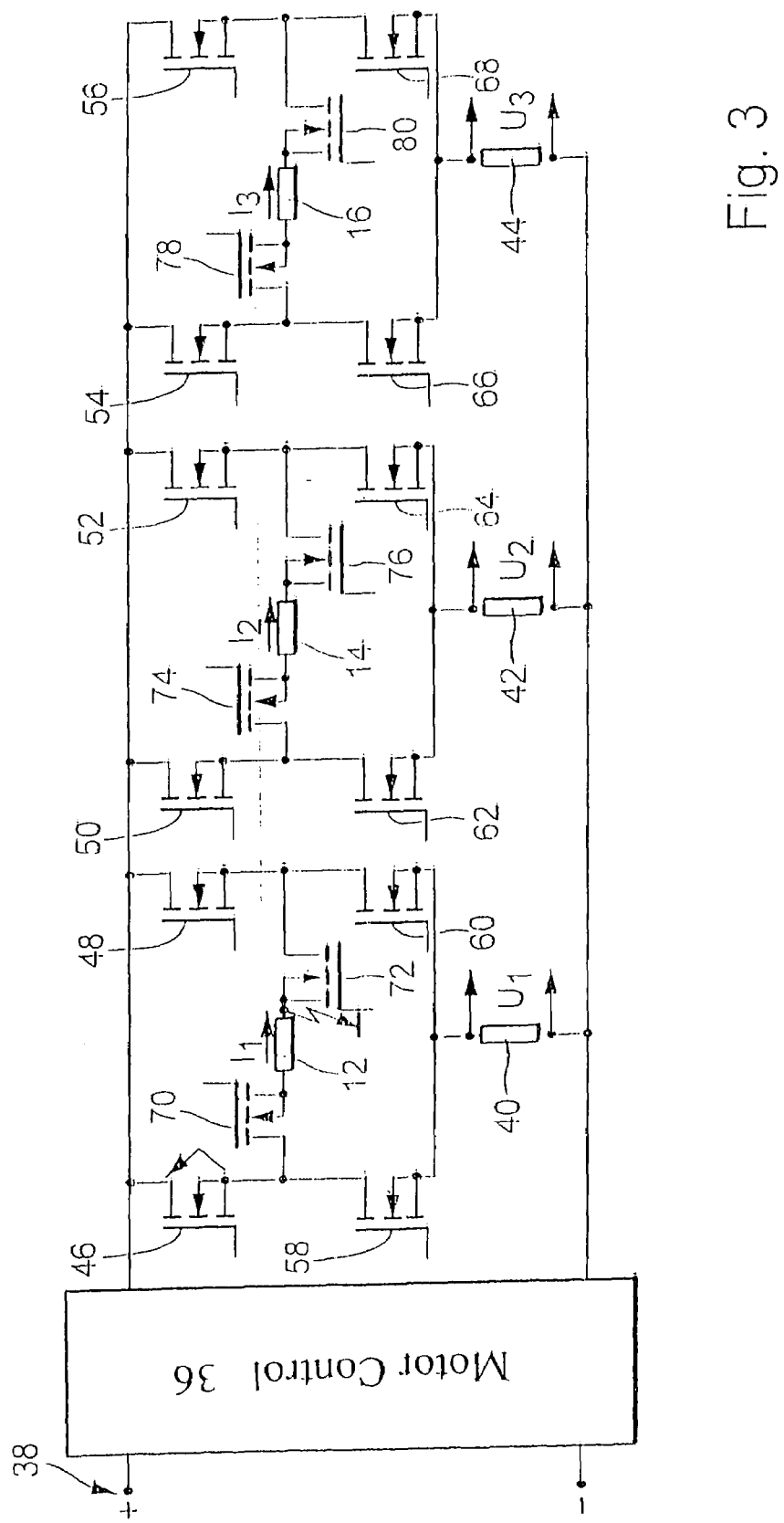

The arrangement in FIG. 3 largely corresponds to the one in FIG. 2 and the corresponding features will not be discussed further here. Parts that are the same in FIGS. 2 and 3 are provided with the same reference numerals. By contrast with the arrangement in FIG. 2, however, the phase windings 12, 14, and 16 here are not incorporated directly into the lateral branches of the full-bridge commutation circuit, but instead a respective additional MOSFET switch 70, 72; 74, 76; 78, 80 is provided on both sides of the phase windings 12, 14, 16 and the two semiconductor switches respectively associated with each phase winding are respectively incorporated into the lateral branch with an opposite conducting direction. It is thus possible, particularly with the use of MOSFET semiconductor switches with their integrated inverse diodes, to disconnect each individual bridge branch and consequently to switch off the associated phase winding. This disconnection process replaces the star point disconnection process in an arrangement according to FIG. 1.

With the circuit arrangement according to FIG. 3, for example, if a malfunction occurs again in the MOSFET switch 46, which causes it to become permanently conductive, then leakage current can no longer flow via the phase winding 12 and the inverse diode of the MOSFET switch 48 because this circuit is broken by the interposed, nonconductive MOSFET switch 70. The same is true in the event of malfunctions in the other MOSFET switches of the commutation device. With the additional measures according to the circuit arrangement in FIG. 3, the MOSFET full-bridge circuit now offers the possibility of opening the additional semiconductor switches 70–80 in the lateral branches of the bridge and therefore switching off the disturbance variable so that a braking moment can no longer occur in the first place, thus resulting in a higher available output, for example for the power-assisted steering of a motor vehicle.

If the malfunction occurring is a winding short, for example in the phase winding 12, then it is not in fact possible to switch off the disturbance variable by opening the semiconductor switches 70 and 72 and a braking moment is generated. Since the two other phase windings of the motor remain unaffected, though, the unassisted steering function is maintained.

In the above-discussed use as a drive motor of an electrical power-assisted steering unit in a motor vehicle, it is thus assured that in the event of a malfunction, the motor can be influenced so that no braking moment acts on the steering and at least the manual steering function, unassisted by a power assist mechanism, is maintained. Other uses of safety-critical auxiliary drive units in motor vehicles include, for example, an electric brake or an electric gas pedal in which electronically commutatable motors with permanent magnets in the rotor can advantageously also be used as drive units.

Both in the form of a half-bridge circuit with a disconnectable star point and in the form of a full-bridge circuit for commutation, the motor wiring according to invention consequently also offers the possibility of switching off a leakage current that generates a moment that works in opposition to the provided drive unit. The full-bridge circuit offers the particular advantage that each phase winding can be controlled separately, which means that in the event of a malfunction in an output stage, the braking moment generated can be canceled out by the two other bridge branches and a limp-home operation can be provided. Furthermore, with the full-bridge circuit, it is also possible to compensate for a winding short in one phase winding; when disconnecting the star point in a half-bridge circuit, it is possible to suppress at least a part of the opposing moment. Also with the full-bridge circuit, the current signals can be directly associated with the corresponding phase winding so that each phase winding is measured separately and the curve shape of the phase current can be established separately for each phase winding without incurring further costs, which significantly increases compensation possibilities in the event of a malfunction.

In the exemplary embodiments, the commutation device is described in conjunction with the use of MOSFET switches as the semiconductor components. MOSFET switches of this kind are suitable because of their low power loss and their high resistance to malfunction, but are also suitable because the supply voltage is not critical to them and they can easily be integrated into circuits and, in addition to being used in commutation control, they are also particularly suitable for disconnecting the star point.

However, instead of using MOSFET switches, the star point in the half-bridge circuit according to FIG. 1 can also be disconnected by means of power transistors, relays, or—in a manner comparable to airbags—pyrotechnic devices. In any case, the components used for disconnecting the star points must be designed for the full phase current and in addition, both the additional losses and the accompanying generation of heat must be taken into account. With a full-bridge circuit according to FIG. 2, if a phase winding fails due to a malfunction in a semiconductor switch, the two intact phase windings can be controlled so that the braking moment is compensated for or even overcome. This can also be used to counteract a short circuit in a winding without requiring additional components. In the exemplary uses mentioned above, the short circuit current is on the same order of magnitude as the rated currents and therefore the corresponding design of the components is also sufficient for controlling short circuit currents.

The foregoing relates to preferred exemplary embodiments of the invention, it being understood that other variants and embodiments thereof are possible within the spirit and scope of the invention, the latter being defined by the appended claims.

What is claimed is:

1. In an electronically commutatable motor for use as a drive motor of a safety-critical auxiliary drive unit in a motor vehicle with a multi-phase excitation winding in the stator, which, in order to generate a torque for a permanent magnet rotor, can be connected to a direct current source via a motor control unit and a commutation device equipped with semiconductor switches, the improvement comprising means for suppressing or at least partially compensating for a braking moment that is generated by the motor in the event of a winding short and/or a malfunction in the semiconductor switches of the commutation device by the operation of the motor with the remaining unaffected phase windings, wherein the motor comprises a full-bridge circuit comprised of semiconductor switches operable to connect the phase windings (12, 14, 16) of the multi-phase excitation winding individually to the direct current source (38).

2. The motor according to claim 1, further comprising additional semiconductor switches operable to disconnect the phase windings (12, 14, 16) of the multi-phase excitation winding.

3. The motor according to claim 2, wherein the additional semiconductor switches comprise two additional semiconductor switches with opposite conducting directions disposed in each bridge branch, at both ends of each phase winding (12, 14, 16).

4. The motor according to claim 1, wherein the semiconductor switches of the commutation device are embodied as MOSFET switches.

5. The motor according to claim 1, further comprising pyrotechnically means operable to disconnect the phase windings (12, 14, 16) of the multi-phase excitation winding and/or the bridge branches of the commutation device.

6. The motor according to claim 1, further comprising pulse-width modulation means controlling the phase currents ($I_1$, $I_2$, $I_3$).

7. The motor according to claim 6, wherein, in the current flow pauses of the phase currents, an active free-running is generated by means of a pulsed switching-on of another semiconductor switch of the commutation device.

8. In an electronically commutatable motor for use as a drive motor of a safety-critical auxiliary drive unit in a motor vehicle with a multi-phase excitation winding in the stator, which, in order to generate a torque for a permanent magnet rotor, can be connected to a direct current source via a motor control unit and a commutation device equipped with semiconductor switches, the improvement comprising means for suppressing, or at least partially compensating for a braking moment that is generated by the motor in the event of a winding short and/or a malfunction in the semiconductor switches of the commutation device by the operation of the motor with the remaining unaffected phase windings, wherein the motor comprises a full-bridge circuit comprised of semiconductor switches operable to connect the phase windings (12, 14, 16) of the multi-phase excitation winding individually to the direct current source (38) and the motor further comprises additional semiconductor switches operable to disconnect the phase windings (12, 14, 16) of the multi-phase excitation winding.

9. The motor according to claim 8, wherein the additional semiconductor switches comprise two additional semiconductor switches with opposite conducting directions disposed in each bridge branch, at both ends of each phase winding (12, 14, 16).

10. The motor according to claim 8, wherein the semiconductor switches of the commutation device are embodied as MOSFET switches.

11. The motor according to claim 8, further comprising pyrotechnically means operable to disconnect the phase windings (12, 14, 16) of the multi-phase excitation winding and/or the bridge branches of the commutation device.

12. The motor according to claim 8, further comprising pulse-width modulation means controlling the phase currents ($I_1$, $I_2$, $I_3$,).

13. The motor according to claim 12, wherein, in the current flow pauses of the phase currents, an active free-running is generated by means of a pulsed switching-on of another semiconductor switch of the commutation device.

14. In an electronically commutatable motor for use as a drive motor of a safety-critical auxiliary drive unit in a motor vehicle with a multi-phase excitation winding in the stator, which, in order to generate a torque for a permanent magnet rotor, can be connected to a direct current source via a motor control unit and a commutation device equipped with semiconductor switches, the improvement comprising means for suppressing, or at least partially compensating, for a braking moment that is generated by the motor in the event of a winding short and/or a malfunction in the semiconductor switches of the commutation device by the operation of the motor with the remaining unaffected phase windings, wherein the motor further comprises pyrotechnical means operable to disconnect the phase windings (12, 14, 16) of the multi-phase excitation winding and/or the bridge branches of the commutation device.

15. The motor according to claim 14, further comprising pulse-width modulation means controlling the phase currents ($I_1$, $I_2$, $I_3$,).

16. The motor according to claim 15, wherein, in the current flow pauses of the phase currents, an active free-running is generated by means of a pulsed switching-on of another semiconductor switch of the commutation device.

* * * * *